United States Patent [19]
Hashimoto et al.

[11] Patent Number: 5,932,883
[45] Date of Patent: *Aug. 3, 1999

[54] ION IMPLANTER FOR IMPLANTING ION ON WAFER WITH LOW CONTAMINATION

[75] Inventors: Isao Hashimoto; Kazuo Mera, both of Hitachi, Japan

[73] Assignee: Hitachi, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/886,408

[22] Filed: Jul. 1, 1997

[30] Foreign Application Priority Data

Jul. 3, 1996 [JP] Japan ................................. 8-173286

[51] Int. Cl.[6] .................................................. H01J 37/317
[52] U.S. Cl. .................................. 250/492.21; 250/442.11
[58] Field of Search ........................... 250/492.21, 492.2, 250/442.11, 443.1, 440.11

[56] References Cited

U.S. PATENT DOCUMENTS

| | | | |
|---|---|---|---|
| 4,794,305 | 12/1988 | Matsukawa | 250/442.11 |
| 5,040,484 | 8/1991 | Mears et al. | 250/442.11 |
| 5,084,624 | 1/1992 | Lamure et al. | 250/492.21 |
| 5,440,132 | 8/1995 | Joyner et al. | 250/492.21 |

FOREIGN PATENT DOCUMENTS 1-189845   7/1989   Japan .

*Primary Examiner*—Kiet T. Nguyen
*Attorney, Agent, or Firm*—Fay, Sharpe, Beall, Fagan, Minnich & McKee

[57] ABSTRACT

In order to implant an ion beam on wafers with low contamination, especially in a large capacity ion implanter for implanting for a long time, a rotating holder 1 shaped like a cylinder or a circular cone is provided, and the wafers 2 are arranged inside of the rotating holder 1 so as to be fixed firmly by a centrifugal force acting on the wafers. Thereby, the wafers are implanted with low contamination, because the periphery of the wafer is not supported by any stopper which may otherwise be sputtered and cause contamination.

6 Claims, 2 Drawing Sheets

ION IMPLANTER FOR IMPLANTING ION ON WAFER WITH LOW CONTAMINATION

BACKGROUND OF THE INVENTION

This invention relates to an ion implanter, and it especially relates to the ion implanter suitable for mass separation by implanted oxygen in which oxygen is implanted into a silicon wafer.

An example of a conventional ion implanter is disclosed in Japanese Patent Laid-open No. 1-189845, in which a heat transfer material such as an electrically conductive rubber is provided between a wafer and a holder therefor so as to hold a periphery of the wafer in order to suppress overheating of the wafer caused by being implanted with an ion beam. The wafers are arranged on a disk shaped holder.

In recent years, such an ion implanter used for mass separation by implanted oxygen has been researched and developed rapidly. In such an ion implanter, an oxygen ion is implanted at a predetermined depth in the silicon wafer which is heated to several hundred degrees, and after that, a buried layer of $SiO_2$ is formed in the silicon wafer by performing a thermal annealing treatment.

In a case that a semiconductor device is constructed on such substrate, it becomes possible to realize a high-speed device with less power consumption.

In the conventional ion implanter which is used in a semi-conductor process, ions are implanted with an ion dose of $10^{14}$ to $10^{15}$ /cm$^2$. However, in the wafer for mass separation by implanted oxygen, ions should be implanted with the ion dose of $10^{17}$ to $10^{18}$ /cm$^2$. When the periphery of the wafer is held with a holder, the periphery of the wafer is not implanted with the oxygen and the holder is sputtered so as to form a contaminated material.

Furthermore, it is neccessary for the wafer to be implanted while being heated to a temperature of several hundred degrees. The wafers arranged on the disk are supported with a stopper etc. utilizing centrifugal force without supporting the periphery of the wafer, and a stress concentration or a temperature irregularity arises on the wafer by centrifugal force generated when the stopper turns, and thereby the quality of the wafer is deteriorated.

Furthermore, because more than 100 to 1000 times the number of ions in a conventional case are implanted in this ion implanter, contamination of the wafer should be reduced sufficiently.

Therefore, deflection magnets are provided in order to prevent contaminating substances sputtered from the mass separation. Further, the perpendicular disk mounting structure needs to be installed horizontally, and the device including the disk becomes very large-sized.

SUMMARY OF THE INVENTION

An object of the invention is to provide a small-sized ion implanter suitable for mass separation by implanted oxygen which achieves low contamination.

In order to achieve the above object, in the present invention, the wafers are installed inside a rotating holder shaped like a cylinder, which is cut with a plane perpendicular to a central axis of the cylinder, and centrifugal force on the wafer arranged inside of the rotating holder acts perpendicular to an inside surface of the rotating holder, to thereby hold the wafers on the inside surface of the rotating holder without providing any wafer stopper or periphery stopper.

In the ion implanter as stated above in the present invention, the rotating holder shaped like the cylinder is preferably installed horizontally or perpendicularly, and includes a mechanism to actuate the rotating holder perpendicular to the install direction of the rotating holder.

In the above ion implanter of the present invention, the rotating holder may be shaped like a circular cone which is cut with a plane perpendicular to a central axis of the circular cone, with the wafers installed inside of the circular cone, to thereby achieve an installing angle of the wafer that becomes equal to an angle of the circular cone, and the wafer is implanted perpendicularly by the ion beam when the wafers are rotated.

Further in the above ion implanter in the present invention, a deflection magnet is arranged at a central portion of the rotating holder inside of a vacuum chamber.

Further in the above ion implanter in the present invention, in order to secure a high wafer heating efficiency and temperature uniformity during implanting of the wafers, the rotating holder is constructed so that it is electrically connected to the wafer and is thermally insulated from the wafer.

Further in the above ion implanter in the present invention, as the wafers are arranged inside of the cylindrical or circular cone holder, a centrifugal force on the wafer acts almost perpendicular to the inside surface of the holder, thereby the wafers are firmly fixed without moving or dropping in spite of not being supported at their periphery.

Further, in order to implant the ions uniformly, the rotating holder reciprocates towards a direction parallel to a central axis of the rotating holder.

Further in the circular cone type rotating holder, in order to change the wafers easily, the rotating holder is declined so that the wafers on the rotating holder is installed to be perpendicular or horizontal during the time the rotating holder is rotated.

Further, by arranging the rotating holder outside a deflection magnet, the ion implanter becomes small-sized effectively.

Further, the wafer is supported on the rotating holder with a small contact area constructed with an electrically conductive material such as silicon, or a wafer supporting plate made of electrically conductive material is supported with a material having small thermal conductivity and at the same time the wafer supporting plate is connected to the rotating holder electrically.

DETAILED DESCRIPTION OF THE PREFERRED EMBODIMENTS

Figure 1:
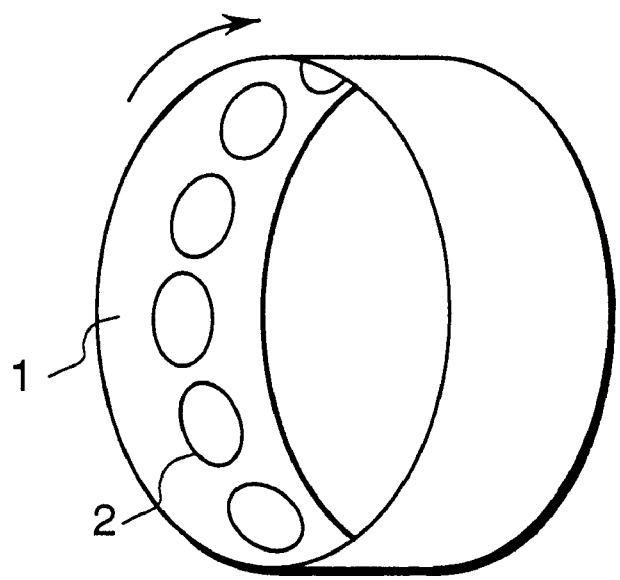
FIG. 1 is a perspective view of an embodiment of the rotating holder in the present invention.

FIG. 1 is a perspective view of a rotating holder of an ion implanter shown as an embodiment in the present invention.

Numeral 1 means a rotating holder shaped like a cylinder which is cut with a plane perpendicular to a central axis of the cylinder, and numeral 2 means a wafer.

When the plural wafers 2 are mounted inside of the rotating holder 1 shaped like a cylinder and the rotating holder 1 rotates, a centrifugal force on the wafer 2 acts perpendicular to a surface of the wafer 2, and the centrifugal force becomes 100 times or more of a weight of the wafer 2 in a case that radius of the rotating holder 1 is 500 mm and the rotational speed is more than 500 rpm, thereby the periphery of the wafer needn't be held, thus creating a contamination-free rotating holder.

Figure 2:
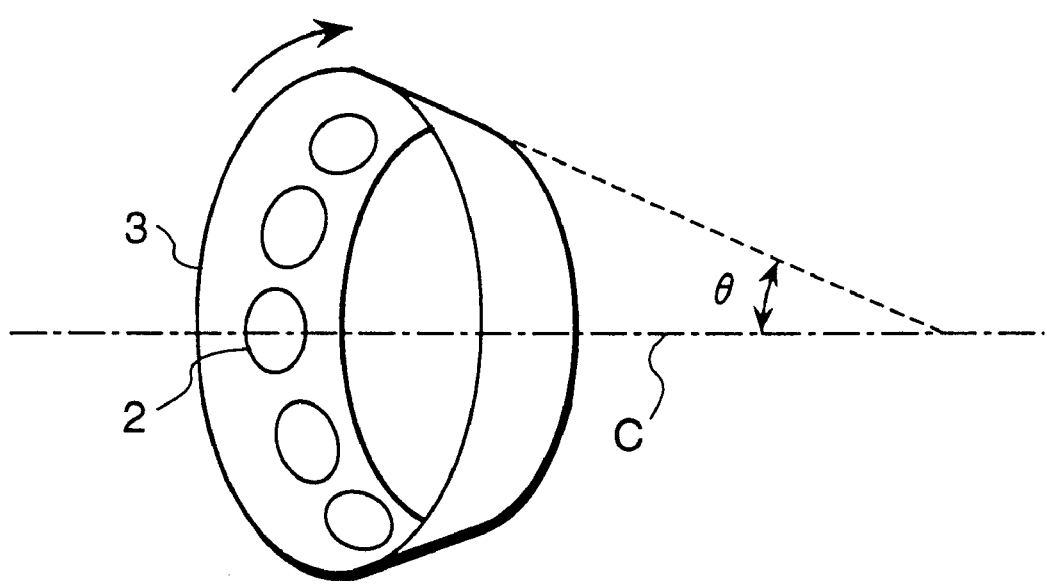
FIG. 2 is a perspective view of an embodiment of the rotating holder shaped like a circular cone in the present invention.

FIG. 2 is a transformation example of the holder shown in FIG. 1 and the surface of the rotating holder 3 declines as shown the figure with an angle θ of less than 20° with respect to a central axis C of the rotating holder 3, and the rotating holder 3 has the same function as in FIG. 1.

Figure 3:
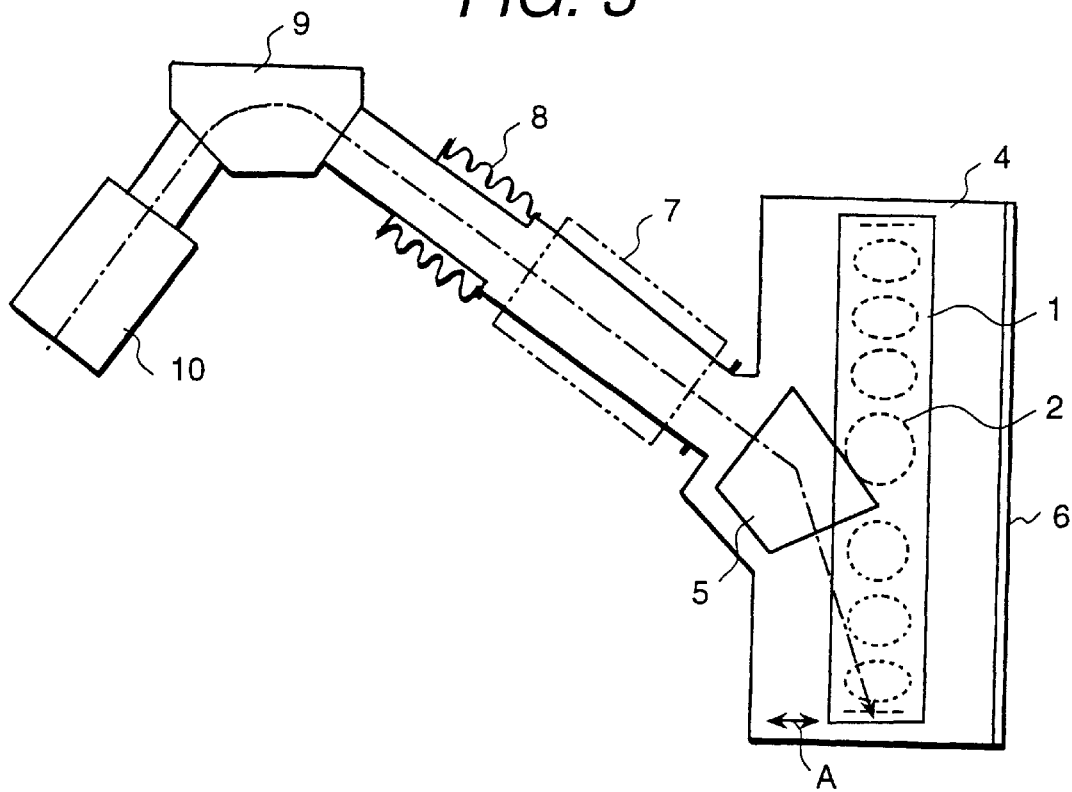
FIG. 3 is a total constructive view of an embodiment of an ion implanter in the present invention.

FIG. 3 shows an embodiment of an ion implanter in the present invention and shows a plan view in which the rotating holder 1, shaped like a cylinder, is installed perpendicularly. The ion implanter is constructed with an ion gun 10 to generate an ion beam, a mass separator magnet 9 to perform mass separation of the beam, an acceleration tube 8 to accelerate the beam separated, magnetic quadrupole lenses 7 to control shape of the beam, a deflection magnet 5 to remove the spattered materials which occur in the mass separator magnet 9 and the acceleration tube 8. The wafer 2 to receive the beam with high purity deflected with the deflection magnet 5. The ion implanter further includes a rotating holder 1 which holds the wafer and has a door 6, and a vacuum chamber 4 surrounding the above. The rotating holder 1 is arranged outside of the deflection magnet 5 and moves to a horizontal direction as shown by an allow A in FIG. 3, which is parallel to a central axis of the rotating holder 1. Thereby the ion implanter becomes very compact.

In this case, the wafers 2 are exchanged in the same way as the conventional method when the wafer is rotated to be in a horizontal position.

Figure 4:
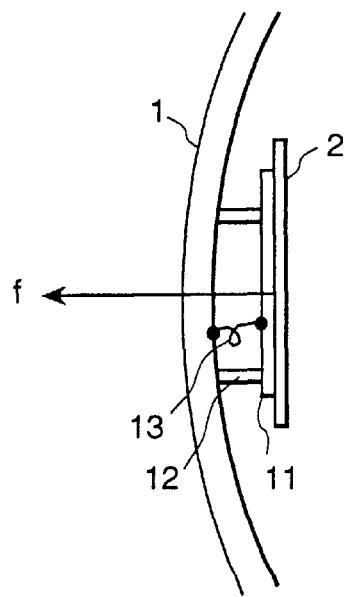
FIG. 4 is a sectional view of an embodiment of a wafer holding means on the rotating holder in the present invention.

FIG. 4 shows a holding construction of the wafer when the rotating holder 1 is rotated in the present invention. A post 12 made of thermal isolation material is arranged on the rotating holder 1, and a supporting plate 11 made of an electrically conductive material is provided thereon.

By connecting the supporting plate 11 with the rotating holder 1 by an electric conductor 13, the wafer 2 being rotated has the same electrical potential as the rotating holder 1 and is almost completely isolated thermally from the rotating holder 1. Further, the wafer does not drop because of the centrifugal force f. Thereby, good rotating holder is provided which does not have any peripheral stopper and which has good thermal and contamination-free characteristics.

As stated above according to the present invention, the rotating holder is shaped like a cylinder or circular cone which is cut with a plane perpendicular to a central axis of the cylinder or the circular cone respectively, and the wafers are mounted inside of the holder, so the centrifugal force of the wafers acts to fix the wafers inside the holder without providing any peripheral supporting means of the wafer which may be sputtered. As a result, an ion implanter with low contamination may be provided.

What is claimed is:

1. An ion implanter comprising an ion gun to generate an ion beam, a mass separator to separate a special ion from said ion beam, an acceletion tube to accelerate said special ion separated by said mass separator, a lens to converge said special ion to a predetermined position, a deflector to remove contaminated materials and to deflect said ion, and a rotating holder to hold wafers, wherein said rotating holder mounts the wafers inside thereof, and is shaped like a cylinder which is cut with a plane perpendicular to a central axis of the cylinder and moves in a direction (A) which is parallel to said central axis, and wherein an inside surface of said rotating holder declines with an angle less than 20° with respect to said central axis.

2. An ion implanter as defined in claim 1, wherein the wafer is thermally isolated from said rotating holder and is electrically connected to said rotating holder.

3. An ion implanter beam comprising an ion gun to generate an ion beam, a mass separator to separate a special ion from said ion beam, an acceleration tube to accelerate said special ion separated by said mass separator, a lens to converge said special ion to a predetermined position, a deflector to remove contaminated materials and to deflect said ion, and a rotating holder to hold the wafers, wherein said rotating holder mounts the wafers inside thereof, and is shaped like a circular cone which is cut with a plane perpendicular to a central axis of the circular cone and moves in a direction (A) which is parallel to said central axis, and an inside surface of said rotating holder declines with an angle of less than 20° with respect to said central axis.

4. An ion implanter as defined in claim 3, wherein the wafer is thermally isolated from said rotating holder and is electrically connected to said rotating holder.

5. An ion implanter comprising, an ion gun to generate an ion beam, a mass separator to separate a special ion from said ion beam, an acceleration tube to accelerate said special ion separated by said mass separator, a lens to converge said special ion to a predetermined position, a deflector to remove contaminated materials and to deflect said special ion, and a rotating holder to hold wafers, wherein said rotating holder is shaped like a cylinder which is cut with a plane perpendicular to the central axis of the cylinder and holds the wafers inside thereof, and said rotating holder being rotatable outside of the deflector, when said rotating holder moves in a direction (A) which is parallel to said central axis, and an inside surface of said rotating holder declines with an angle of less than 20° with respect to said central axis.

6. An ion implanter comprising, an ion gun to generate an ion beam, a mass separator to separate a special ion from said ion beam, an acceleration tube to accelerate said special ion separated by said mass separator, a lens to converge said special ion to a predetermined position, a deflector to remove contaminated materials and to deflect said special ion, and a rotating holder to hold wafers, wherein said rotating holder is shaped like a circular cone which is cut with a plane perpendicular to a central axis of the circular cone and holds the wafers inside thereof, and said rotating holder being rotatable outside of the deflector, when said rotating holder moves in a direction (A) which is parallel to said central axis, and an inside surface of said rotating holder declines with an angle of less than 20° with respect to said central axis.

* * * * *